United States Patent
Yu et al.

(10) Patent No.: US 6,479,173 B1
(45) Date of Patent: *Nov. 12, 2002

(54) SEMICONDUCTOR STRUCTURE HAVING A CRYSTALLINE ALKALINE EARTH METAL SILICON NITRIDE/OXIDE INTERFACE WITH SILICON

(75) Inventors: Zhiyi Yu; Jun Wang, both of Gilbert; Ravindranath Droopad, Chandler; Alexander Demkov, Phoenix; Jerald Allan Hallmark; Jamal Ramdani, both of Gilbert, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/465,623

(22) Filed: Dec. 17, 1999

(51) Int. Cl.$^7$ .................................................. B32B 9/00

(52) U.S. Cl. ........................ 428/698; 428/446; 428/448; 428/697; 428/699; 428/700; 428/702

(58) Field of Search ................................ 428/446, 448, 428/450, 697, 698, 699, 701, 702, 700; 117/944

(56) References Cited

U.S. PATENT DOCUMENTS

| | | | |
|---|---|---|---|
| 5,225,031 A | 7/1993 | McKee et al. | 156/612 |
| 5,393,352 A | 2/1995 | Summerfelt | 148/33.3 |
| 5,450,812 A | 9/1995 | McKee et al. | 117/84 |
| 5,482,003 A | 1/1996 | McKee et al. | 117/108 |
| 5,514,484 A | 5/1996 | Nashimoto | 428/700 |
| 5,830,270 A | 11/1998 | McKee et al. | 117/106 |
| 5,907,792 A * | 5/1999 | Droopad et al. | 438/791 |
| 6,241,821 B1 * | 6/2001 | Yu et al. | 117/108 |
| 6,248,459 B1 * | 6/2001 | Wang et al. | 428/700 |
| 6,291,319 B1 * | 9/2001 | Yu et al. | 438/481 |

OTHER PUBLICATIONS

"Crystalline Oxides on Silicon: The First Five Monolayers", R.A. McKee et al., Physical Review Letters, vol. 81, No. 14, pp. 3014–3017.

"Molecular Beam Epitaxy Growth of Epitaxial Barium Silicide, Barium Oxide, and Barium Titanate on Silicon", R.A. McKee et al., Oak Ridge National Laboratory, 1991 American Institute of Physics, pp. 782–784.

"Molecular Beam Epitaxy of SrTiO$_3$ Films on Si(100)–2×1 with SrO Buffer Layer", Toyokazu Tambo et al., Jpn. J. Appl. Phys., vol. 37(1998) pp. 4454–4459.

"Roles of Buffer Layers in Epitaxial Growth of SrTiO$_3$ Films on Silicon Substrates", Bum Ki Moon et al., Jpn. J. Appl. Phys., vol. 33 (1994) pp. 1472–1477.

"The MBE Growth and Optical Quality of BaTiO$_3$ and SrTiO$_3$ Thin Films on MgO", R.A. McKee et al., Mat. Res. Soc. Symp. Proc. vol. 341, pp. 309–314.

"BaSi$_2$ and Thin Film Alkaline Earth Silicides on Silicon", R.A. McKee et al., Appl. Phys. Lett. 63(20), Nov. 15, 1993, pp. 2818–2820.

(List continued on next page.)

Primary Examiner—Deborah Jones
Assistant Examiner—Stephen Stein
(74) Attorney, Agent, or Firm—Oblon, Spivak, McClelland, Maier & Neustadt, P.C.

(57) ABSTRACT

A semiconductor structure comprises a silicon substrate (10), one or more layers of single crystal oxides or nitrides (26), and an interface (14) between the silicon substrate and the one or more layers of single crystal oxides or nitrides, the interface manufactured with a crystalline material which matches the lattice constant of silicon. The interface comprises an atomic layer of silicon, nitrogen, and a metal in the form MSiN$_2$, where M is a metal. In a second embodiment, the interface comprises an atomic layer of silicon, a metal, and a mixture of nitrogen and oxygen in the form MSi[N$_{1-x}$O$_x$]$_2$, where M is a metal and X is $0 \leq X < 1$.

53 Claims, 4 Drawing Sheets

OTHER PUBLICATIONS

"Surface Structures and the Orthorhombic Transformation of Thin Film $BaSi_2$ on Silicon", R. A. McKee et al., Mat. Res. Soc. Symp. Proc., vol. 221., pp. 131–136.

"Epitaxial Growth of $SrTiO_3$ Films on Si(100) Substrates Using a Focused Electron Beam Evaporation Method", Hiroyuki Mori et al., Jpn. J. Appl. Phys., vol. 30, (1991), pp.1415–1417.

"Growth of Crystalline $SrTiO_3$ Films on Si Substrates Using Thin Flouride Buffer Layers and Their Electrical Properties", Bum Ki Moon et al., Jpn. J. Appl. Phys. vol. 33 (1994), pp. 5911–5916.

"Heteroepitaxy of Dissimilar Materials", Materials Research Society Symposium Proceedings, vol. 221, pp. 29–34, May 1991.

"Heteroepitaxy on Silicon: Fundamentals, Structure, and Devices", Materials Research Society Symposium Proceedings, vol. 116, pp. 369–374, Apr. 1988.

"A Preliminary Consideration of the Growth Behaviour of $CeO_2$, $SrTiO_3$ and $SrVO_3$ films on Si Substrate", Hirotoshi Nagata, Thin Solid Films, 224(1993), pp. 1–3.

"Heteroepitaxial Growth of $CeO_2$(001) Films on Si(001) Substrates by Pulsed Laser Deposition in Ultrahigh Vacuum", Hirotoshi Nagata et al., Jpn. J. Appl. Phys., vol. 30 (1991), pp. 1136–1138.

"Heteroepitaxial Growth of SrO films on Si Substrates", Yuichi Kado et al., J. Appl. Phys. 61(6), 1987, pp.2398–2400.

"Silicon Molecular Beam Epitaxy", Materials Research Society Symposium Proceedings, vol. 220, pp. 595–600, May 1991.

"Effects of Buffer Layers in Epitaxial Growth of $SrTiO_3$ Thin Film on Si(100)", Osamu Nkagawara et al., J. Appl. Phys. (1995), pp. 7226–7230.

"A Proposal of Epitaxial Oxide Thin Film Structures for Future Oxide Electronics", M. Suzuki et al., Materials Science and Engineering B41 (1996), pp. 166–173.

* cited by examiner

<110> DIRECTION        ← <1̄10> DIRECTION

*FIG. 14*

⟨110⟩ DIRECTION  ⟵ ⟨1̄10⟩ DIRECTION

*FIG. 15*

SEMICONDUCTOR STRUCTURE HAVING A CRYSTALLINE ALKALINE EARTH METAL SILICON NITRIDE/OXIDE INTERFACE WITH SILICON

FIELD OF THE INVENTION

The present invention relates in general to a semiconductor structure including a crystalline alkaline earth metal nitride-based interface between a silicon substrate and oxides or other nitrides, and more particularly to an interface including an atomic layer of an alkaline earth metal, silicon, and nitrogen.

BACKGROUND OF THE INVENTION

An ordered and stable silicon (Si) surface is most desirable for subsequent epitaxial growth of single crystal thin films on silicon for numerous device applications, e.g., ferroelectrics or high dielectric constant oxides for non-volatile high density memory and logic devices. It is pivotal to establish an ordered transition layer on the Si surface, especially for subsequent growth of single crystal oxides, e.g., perovskites.

Some reported growth of these oxides, such as BaO and BaTiO$_3$ on Si(100) was based on a BaSi$_2$ (cubic) template by depositing one fourth monolayer of Ba on Si(100) using reactive epitaxy at temperatures greater than 850° C. See for example: R. McKee et al., *Appl. Phys. Lett.* 59(7), pp 782–784 (Aug. 12, 1991); R. McKee et al., *Appl. Phys. Lett.* 63(20), pp. 2818–2820 (Nov. 15, 1993); R. McKee et al., *Mat. Res. Soc. Symp.* Proc., Vol. 21, pp. 131–135 (1991); R. A. McKee, F. J. Walker and M. F. Chisholm, "Crystalline Oxides on Silicon: The First Five Monolayers", *Phys. Rev. Lett.* 81(14), 3014-7 (Oct. 5, 1998). U.S. Pat. No. 5,225,031, issued Jul. 6, 1993, entitled "Process for Depositing an Oxide Epitaxially onto a Silicon Substrate and Structures Prepared with the Process"; and U.S. Pat. No. 5,482,003, issued Jan. 9, 1996, entitled "Process for Depositing Epitaxial Alkaline Earth Oxide onto a Substrate and Structures Prepared with the Process". However, atomic level simulation of this proposed structure indicates that it likely is not stable at elevated temperatures.

Growth of SrTiO$_3$ on silicon (100) using an SrO buffer layer has been accomplished. T. Tambo et al., *Jpn. J. Appl. Phys.*, Vol. 37 (1998), pp. 4454–4459. However, the SrO buffer layer was thick (100 Å), thereby limiting application for transistor films, and crystallinity was not maintained throughout the growth.

Furthermore, SrTiO$_3$ has been grown on silicon using thick metal oxide buffer layers (60–120 Å) of Sr or Ti. B. K. Moon et al., *Jpn. J. Appl. Phys.*, Vol. 33 (1994), pp. 1472–1477. These thick buffer layers would limit the application for transistors.

Therefore, a thin, stable crystalline interface with silicon is needed.

DETAILED DESCRIPTION OF THE PREFERRED EMBODIMENT

To form the novel interface between a silicon (Si) substrate and one or more layers of a single crystal oxide or nitride, various approaches may be used. Several examples will be provided for both starting with a Si substrate having a clean surface, and a Si substrate having silicon nitride (Si$_3$N$_4$ or the like) on the surface. Si$_3$N$_4$ is amorphous rather than single crystalline and it is desirable for purposes of growing additional single crystal material on the substrate that a single crystal nitride be provided as the interface.

Figure 1:
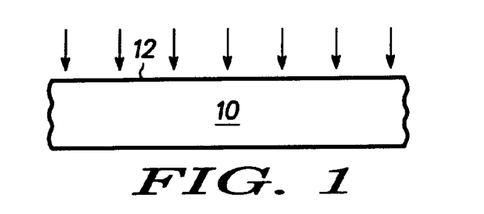
FIGS. 1–2 illustrate a cross-sectional view of a clean semiconductor substrate having an interface formed thereon in accordance with the present invention.
Figure 2:
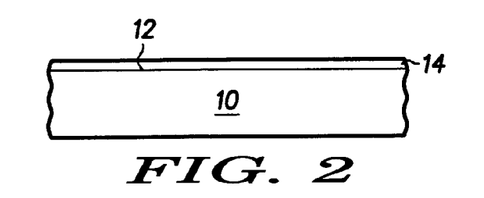
Figure 3:
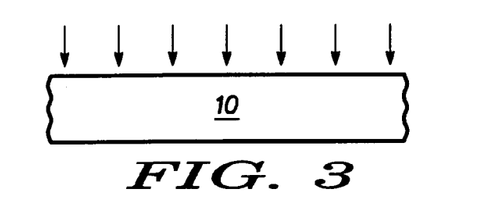
FIGS. 3–6 illustrate a cross-sectional view of a semiconductor substrate having an interface formed from a silicon nitride layer in accordance with the present invention.
Figure 4:
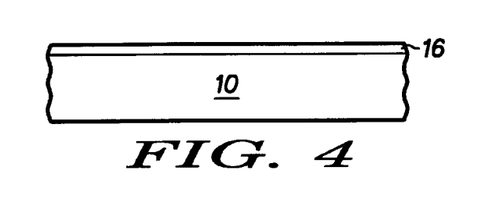

Turning now to the drawings in which like elements are designated with like numbers throughout, FIGS. 1 and 2 illustrate a semiconductor structure including a Si substrate 10 having a clean surface 12. A clean (2×1) surface 12 may be obtained with any conventional cleaning procedure, for example, with thermal desorption of SiO$_2$ at a temperature greater than or equal to 850° C., or by removal of the hydrogen from a hydrogen terminated Si(1×1) surface at a temperature greater than or equal to 300° C. in an ultra high vacuum. Hydrogen termination is a well known process in which hydrogen is loosely bonded to dangling bonds of the silicon atoms at surface 12 to complete the crystalline structure. The interface 14 of a crystalline material may be formed by supplying (as shown by the arrows in FIG. 1) controlled amounts of a metal, Si, and activated nitrogen, either simultaneously or sequentially to the surface 12 at a temperature less than or equal to 900° C. in a growth chamber with N$_2$ partial pressure less than or equal to 1×10$^{-6}$ mBar. The metal applied to the surface 12 to form the interface 14 may be any metal, but in the preferred embodiment comprises an alkaline-earth-metal, such as barium (Ba) or strontium (Sr).

As the application of the Ba, Si, and activated nitrogen form BaSiN$_2$ as the interface 14, the growth is monitored using Reflection High Energy Electron Diffraction (RHEED) techniques which are well documented in the art and which can be used in situ, i.e., while performing the exposing step within the growth chamber. The RHEED techniques are used to detect or sense surface crystalline structures and in the present process change rapidly to strong and sharp streaks by the forming of an atomic layer of the BaSiN$_2$. It will of course be understood that once a specific manufacturing process is provided and followed, it may not be necessary to perform the RHEED techniques on every substrate.

The novel atomic structure of the interface 14 will be described in subsequent paragraphs.

It should be understood by those skilled in the art that the temperatures and pressures given for these processes are recommended for the particular embodiment described, but the invention is not limited to a particular temperature or pressure range.

Alternatively, in forming the interface 14, oxygen may be supplied along with the metal, silicon, and nitrogen to form a mixture. The ratio of nitrogen to oxygen may vary substantially, but preferably would be approximately 80%.

Figure 5:
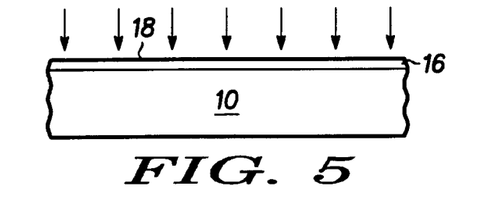
Figure 6:
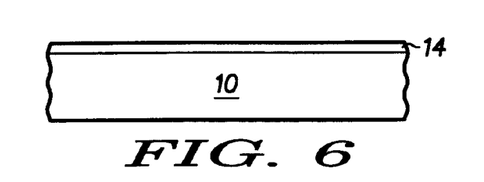

Referring to FIGS. 3–6, another approach comprises forming a Si substrate 10 having a surface 12, and a layer 16 of silicon nitride thereupon. The layer 16 of silicon nitride can be formed purposely in a controlled fashion known in the art, e.g., by applying (arrows) active nitrogen onto the surface 12. The silicon nitride layer can also be formed on Si substrate using both silicon and active nitrogen in an ultra high vacuum. See for example, R. Droopad, et. al., U.S. Pat. No. 5,907,792, issued May 25, 1999, entitled "Method of Forming a Silicon Nitride Layer". The novel interface 14 may be formed at least in one of the two suggested embodiments as follows: By applying an alkaline-earth-metal to the surface 18 of silicon nitride layer 16 at 700–900° C., under an ultra high vacuum. More specifically, the Si substrate 10 and the amorphous silicon nitride layer 16 are heated to a temperature below the sublimation temperature of the silicon nitride layer 16. This can be accomplished in a molecular beam epitaxy chamber or Si substrate 10 can be at least partially heated in a preparation chamber after which it can be transferred to the growth chamber and the heating completed. Once the Si substrate 10 is properly heated and the pressure in the growth chamber has been reduced appropriately, the surface 12 of the Si substrate 10 having silicon nitride layer 16 thereon is exposed to a beam of metal, preferably an alkaline-earth-metal, as illustrated in FIG. 5. In a preferred embodiment, the beam is Ba or Sr which is generated by resistively heating effusion cells or from e-beam evaporation sources. In a specific example, Si substrate 10 and silicon nitride layer 16 are exposed to a beam of Ba. The Ba joins the silicon nitride and converts the silicon nitride layer 16 into the interface 14 comprising $BaSiN_2$ in a crystalline form. Alternatively, an alkaline-earth-metal may be provided to the surface 18 at lower temperatures, annealing the result at 700–1000° C., in an ultra high vacuum. In another embodiment, oxygen may be supplied with the nitrogen to form the interface 14, resulting in a ordered form of $BaSi[N_{1-x}O_x]_2$.

Once the interface 14 is formed, one or more layers of a single crystal oxide, nitride, or combination thereof, may be formed on the surface of the interface 14. However, an optional layer of an alkaline-earth-metal oxide, such as BaO or SrO, may be placed between the interface 14 and the single crystal oxide. This alkaline-earth-metal oxide provides a low dielectric constant (advantageous for certain uses such as memory cells) and also prevents oxygen from migrating from the single crystal oxide to the Si substrate 10.

Figure 7:
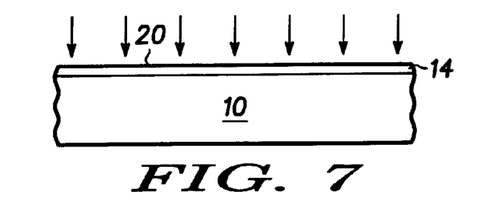
FIGS. 7–8 illustrate a cross-sectional view of an alkaline-earth-metal nitride layer formed on the structures illustrated in FIGS. 1–6 in accordance with the present invention.
Figure 8:
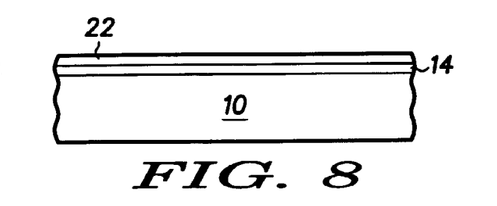
Figure 9:
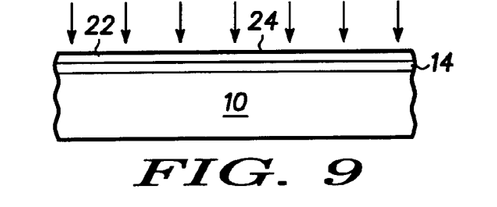
FIGS. 9–12 illustrate a cross-sectional view of a perovskite formed on the structures of FIGS. 1–8 in accordance with the present invention.
Figure 10:
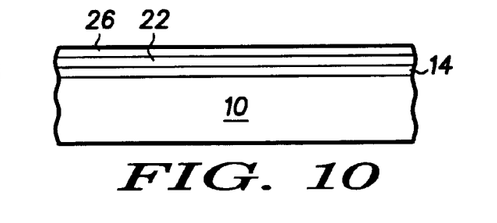
Figure 11:
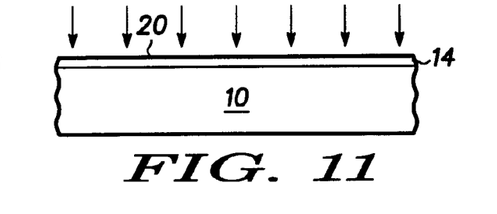
Figure 12:
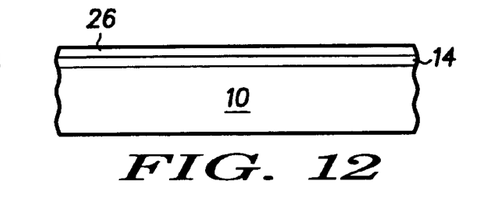

Referring to FIGS. 7 and 8, the formation of alkaline-earth-metal nitride layer 22 may be accomplished by either the simultaneous or alternating supply to the surface 20 of the interface 14 of an alkaline-earth-metal and active nitrogen at less than or equal to 700° C. and under $N_2$ partial pressure less than or equal to $1 \times 10^{-5}$ mBar. This alkaline-earth-metal nitride layer 22 may, for example, comprise a thickness of 50–500 Å.

Referring to FIGS. 9–12, a single crystal oxide layer 26, such as an alkaline-earth-metal perovskite, may be formed on either the surface 20 of the interface 14 or the surface 24 of the alkaline-earth-metal nitride layer 22 by either the simultaneous or alternating supply of an alkaline-earth-metal oxide, oxygen, and a transition metal, such as titanium, at less than or equal to 700° C. under an oxygen partial pressure less than or equal to $1 \times 10^{-5}$ mBar. This single crystal oxide layer 26 may, for example, comprise a thickness of 50–1000 Å and will be substantially lattice matched with the underlying interface 14 or alkaline-earth-metal oxide layer 22. It should be understood that the single crystal oxide layer 26 may comprises one or more layers in other embodiments.

Figure 13:
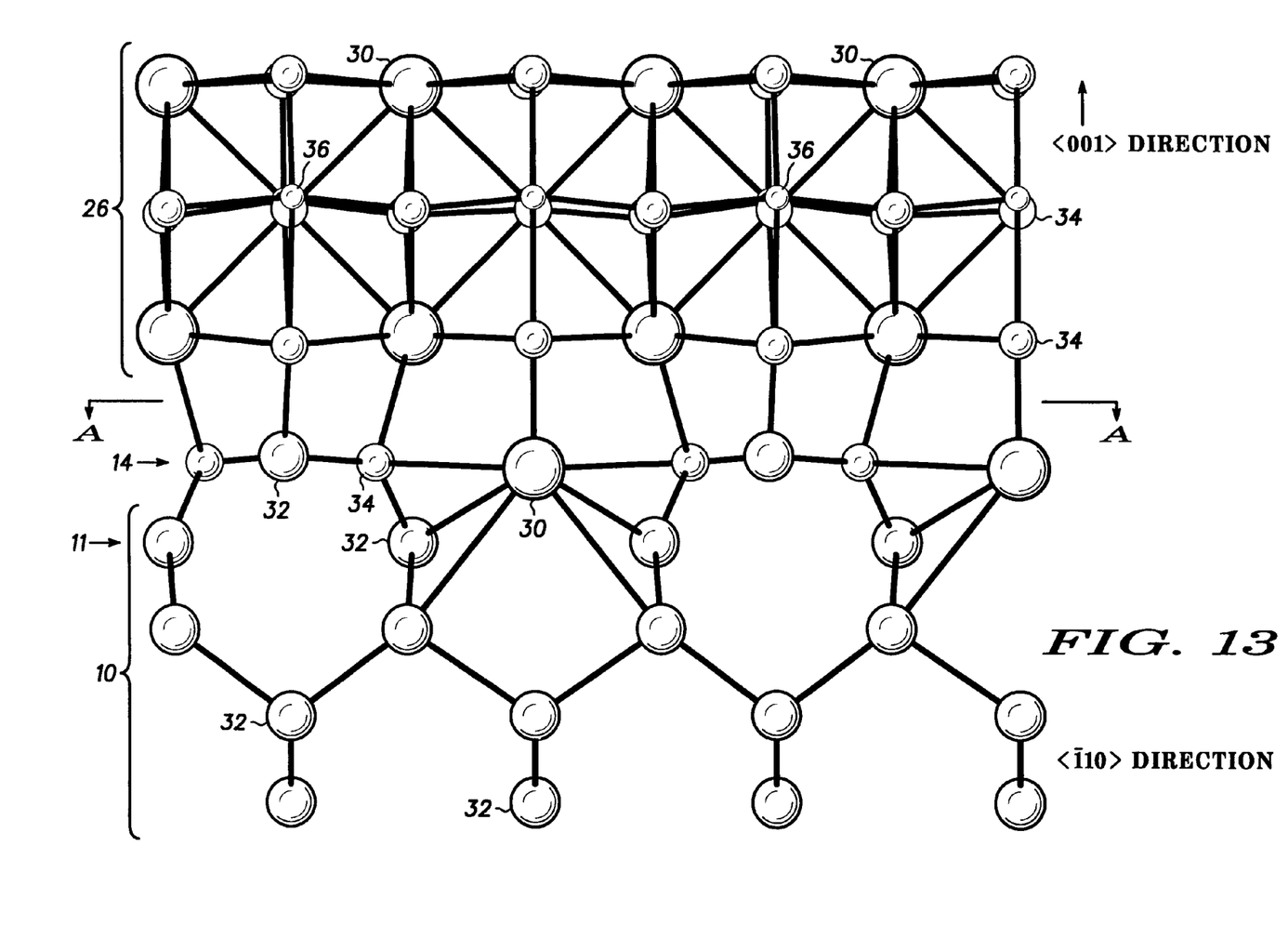
FIG. 13 illustrates a side view of the atomic structure of one embodiment of the layers of FIG. 12 in accordance with the present invention.

Referring to FIG. 13, a side view (looking in the $<\bar{1}10>$ direction) of the atomic configuration of the Si substrate 10, interface 14, and alkaline-earth-metal metal oxygen layer 26 is shown. The configuration shown comprises, in relative sizes, for illustrative purposes, from larger to smaller, strontium atoms 30, silicon atoms 32, nitrogen atoms 34, and titanium atoms 36. The Si substrate 10 comprises only silicon atoms 32. The interface 14 comprises metal atoms (which in the preferred embodiment are illustrated as strontium atoms 30), silicon atoms 32, and nitrogen atoms 34. The alkaline-earth-metal nitrogen layer 26 comprises strontium atoms 30, nitrogen (or a combination of nitrogen and oxygen) atoms 34, and titanium atoms 36.

Figure 14:
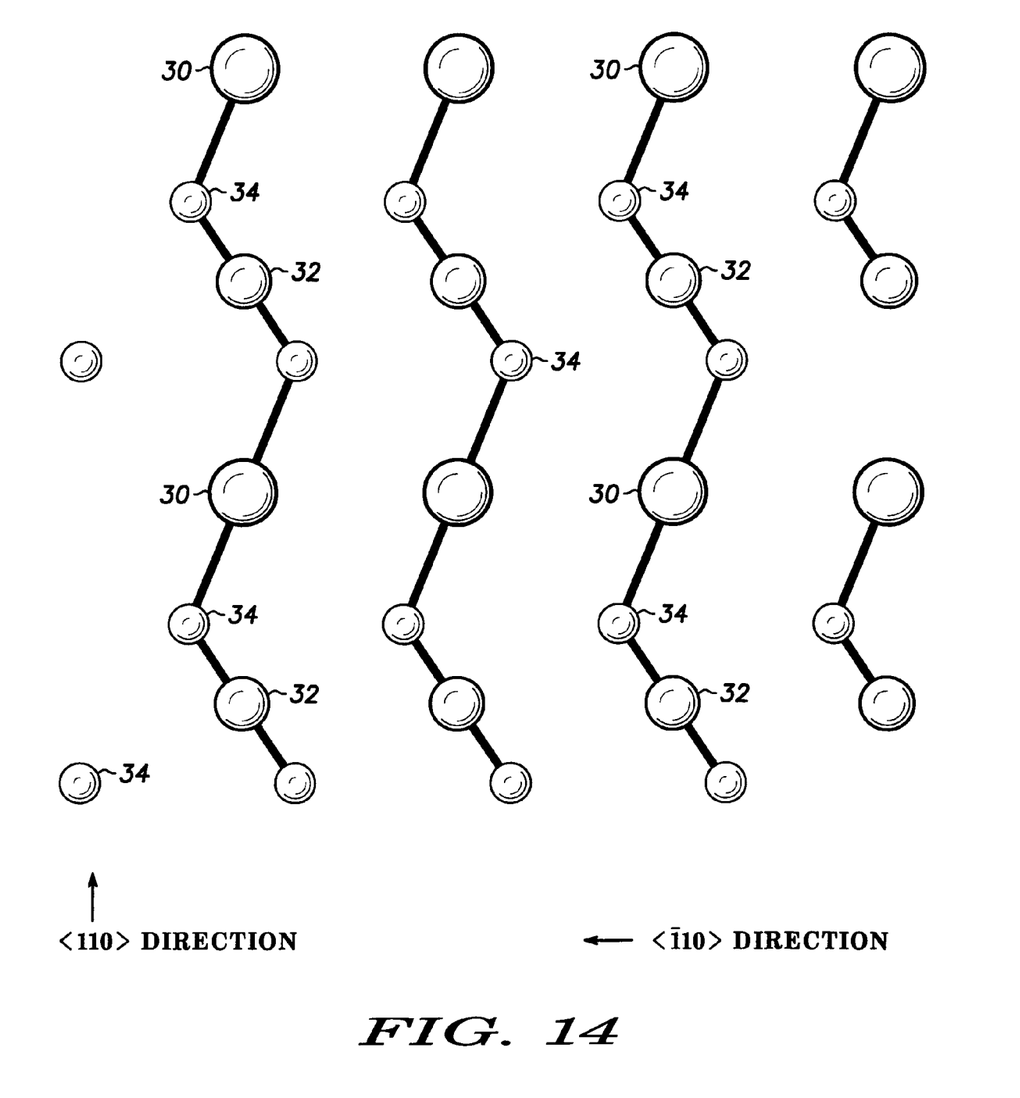
FIG. 14 illustrates a top view along view line AA of FIG. 13 of the interface.

Referring to FIG. 14, a top view of the interface along view line AA of FIG. 13, shows the arrangement of the strontium, silicon, and nitrogen atoms 30, 32, 34.

Figure 15:
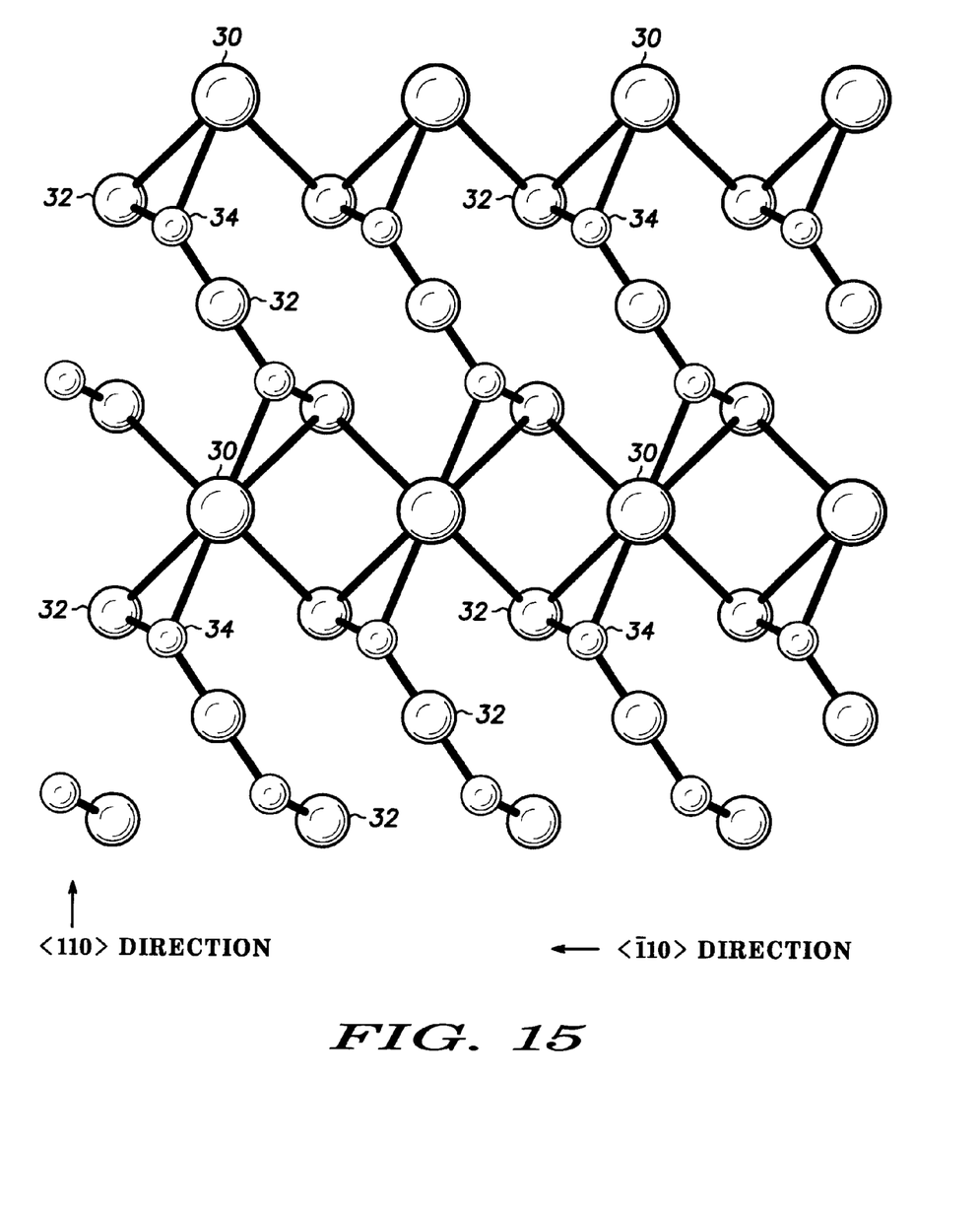
FIG. 15 illustrates a top view along view line AA of FIG. 13 including the interface and the adjacent atomic layer of the substrate.

Referring to FIG. 15, a top view along line AA of FIG. 13, shows the interface 14 and the top atomic layer 11 of the Si substrate 10.

For this discussion, a monolayer equals $6.8 \times 10^{14}$ atoms/$cm^2$ and an atomic layer is one atom thick. It is seen that the interface 14 shown in the FIGs. comprises a single atomic layer, but could be more than one atomic layer, while the Si substrate 10 and the alkaline-earth-metal metal nitrogen layer may be many atomic layers. Note that in FIG. 13, only four atomic layers of the Si substrate 10 and only two atomic layers of the alkaline-earth-metal metal nitride layer 26 are shown. The interface 14 comprises a half monolayer of the alkaline-earth-metal, a half monolayer of silicon, and a monolayer of nitrogen. Each strontium atom 30 is substantially equally spaced from four of the silicon atoms 32 in the Si substrate 10. The silicon atoms 32 in the interface 14 are substantially on a line and equally spaced between the alkaline-earth-metal atoms in the <110> direction. Each silicon atom 32 in the top layer of atoms in the Si substrate 10 is bonded to a nitrogen atom 34 in the interface 14 and each silicon atom 32 in the interface 14 is bonded to two nitrogen atoms 34 in the interface 14. The three-fold bonding coordination of the nitrogen atoms at the interface 14 is satisfied in this interface structure, which greatly lowers the total energy of the interface layer 14, thus enhancing its stability. The interface 14 comprises rows of strontium, silicon, and nitrogen atoms 30, 32, 34 in a 2×1 configuration on a (001) surface of the Si substrate 10, 1× in the $<\bar{1}10>$ direction and 2× in the <110> direction. The interface 14 has a 2×1 reconstruction.

A thin, crystalline interface 14 with silicon 10 has been described herein. The interface 14 may comprise a single atomic layer. Better transistor applications are achieved by the interface 14 being thin, in that the electrical coupling of the overlying oxide layers to the Si substrate 10 is not compromised, and in that the interface 14 is more stable since the atoms will more likely maintain their crystallinity in processing. This alkaline earth metal-Si-nitrogen-based interface also acts as a diffusion barrier to oxygen and possibly other elements.

What is claimed is:

1. A semiconductor structure comprising:
   a silicon substrate;
   one or more layers of single crystal material; and an interface between the silicon substrate and the one or more layers of single crystal material, the interface comprising an atomic layer of a crystalline material which matches the lattice constant of silicon, the crystalline material comprising silicon, nitrogen, and a metal.

2. The semiconductor structure of claim 1 wherein the crystalline material further comprises oxygen.

3. The semiconductor structure of claim 1 wherein the one or more layers of single crystal material comprises a nitride layer formed adjacent the interface, the nitride layer having a first nitrogen atom adjacent and aligned in the <001> direction with a metal atom in the interface, and having a second nitride atom adjacent and aligned in the <001> direction with a silicon atom in the interface.

4. The semiconductor structure of claim 1 wherein the one or more layers of single crystal material comprises an oxide layer formed adjacent the interface, the oxide layer having a first oxygen atom adjacent and aligned in the <001> direction with a metal atom in the interface, and having a second oxygen atom adjacent and aligned in the <001> direction with a silicon atom in the interface.

5. The semiconductor structure of claim 1 wherein the one or more layers of single crystal material comprises a mixture of oxygen and nitrogen formed adjacent the interface, having a first nitrogen or first oxygen atom adjacent and aligned in the <001> direction with a metal atom in the interface, and having a second nitrogen or second oxygen atom adjacent and aligned in the <001> direction with a silicon atom in the interface.

6. The semiconductor structure of claim 1 wherein the atomic layer of the interface comprises a two dimensional periodic array including metal atoms M, silicon atoms Si, and X atoms, where X is one of nitrogen atoms or a combination of nitrogen and oxygen atoms of the form:

7. The semiconductor structure of claim 1 wherein the interface and the atomic layer of the silicon substrate adjacent the interface comprises a two dimensional periodic array including metal atoms M, silicon atoms Si, and X atoms in the interface, where X is one of nitrogen atoms or a combination of nitrogen and oxygen atoms, and Si' atoms in the substrate of the form:

8. The semiconductor structure of claim 1 wherein the metal is an alkaline-earth-metal.

9. The semiconductor structure of claim 8 wherein the alkaline-earth-metal is selected from the group of barium and strontium.

10. The semiconductor structure of claim 1 wherein the atomic layer of the interface comprises:
    a half of a monolayer of an alkaline-earth-metal;
    a half of a monolayer of silicon; and
    a monolayer of one of nitrogen or a combination of nitrogen and oxygen.

11. The semiconductor structure of claim 10 wherein the silicon substrate includes a layer of silicon atoms adjacent to the interface, each atom of the alkaline-earth-metal in the atomic layer of the interface being substantially equally spaced from four silicon atoms in the silicon substrate.

12. The semiconductor structure of claim 11 wherein the interface comprises rows of atoms in a 2×1 configuration on a (001) surface of the silicon substrate, 1× in the <$\bar{1}$10> direction and 2× in the <110> direction.

13. The semiconductor structure of claim 10 wherein the silicon atoms in the interface are substantially on a line and equally spaced between the alkaline-earth-metal atoms in the <110> direction.

14. The semiconductor structure of claim 1 wherein the crystalline material further comprises oxygen and each silicon atom in the layer of atoms in the silicon substrate adjacent to the interface is bonded to a nitrogen or oxygen atom in the interface and each silicon atom in the interface is bonded to two atoms in the interface, the two atoms being one of two nitrogen atoms, two oxygen atoms, or one nitrogen atom and one oxygen atom.

15. The semiconductor structure of claim 1 wherein the interface has a 2×1 reconstruction.

16. A semiconductor structure comprising:
    a silicon substrate having a surface;
    a material; and
    a layer comprising $MSiN_2$ forming an interface between the surface of the silicon substrate and the material, where M is a metal.

17. The semiconductor structure of claim 16 wherein the layer is a single atomic layer.

18. The semiconductor structure of claim 17 wherein the metal comprises an alkaline-earth-metal.

19. The semiconductor structure of claim 18 wherein the alkaline-earth-metal is selected from the group of barium and strontium.

20. The semiconductor structure of claim 16 wherein the material comprises an nitride layer formed adjacent the interface, the nitride layer having a nitrogen atom adjacent and aligned in the <001> direction with a metal atom in the interface, and having an nitrogen atom adjacent and aligned in the <001> direction with a silicon atom in the interface.

21. The semiconductor structure of claim 16 wherein the atomic layer of the interface comprises a two dimensional periodic array including metal atoms M, silicon atoms Si, and nitrogen atoms N of the form:

22. The semiconductor structure of claim 16 wherein the atomic layer of the interface and the atomic layer of the silicon substrate adjacent the interface comprises the two dimensional periodic array including metal atoms M, silicon atoms Si, and nitrogen atoms N of the form:

23. The semiconductor structure of claim 16 wherein the atomic layer of the interface comprises:
   a half of a monolayer of an alkaline-earth-metal;
   a half of a monolayer of silicon; and
   a monolayer of nitrogen.

24. The semiconductor structure of claim 23 wherein the silicon substrate includes a layer of silicon atoms adjacent to the interface, each atom of the alkaline-earth-metal in the atomic layer adjacent to the substrate being substantially equally spaced from four silicon atoms in the silicon substrate.

25. The semiconductor structure of claim 24 wherein the interface comprises rows of atoms in a 2×1 configuration on a (001) surface of the silicon substrate, 1× in the <$\bar{1}$10> direction and 2× in the <110> direction.

26. The semiconductor structure of claim 25 wherein the silicon atoms in the interface are substantially on a line and equally spaced between the alkaline-earth-metal atoms in the <110> direction.

27. The semiconductor structure of claim 16 wherein each silicon atom in the layer of atoms in the silicon substrate adjacent to the interface is bonded to an nitrogen a tom in the interface and each silicon atom in the interface is bonded to two nitrogen atoms in the interface.

28. The semiconductor structure of claim 16 wherein the interface has a 2×1 reconstruction.

29. A semiconductor structure comprising:
   a silicon substrate having a surface;
   a material; and
   a layer comprising $MSi[N_{1-x}O_x]_2$ forming an interface between the surface of the silicon substrate and the material, where M is a metal and $0 \leq X < 1$.

30. The semiconductor structure of claim 29 wherein the layer is a single atomic layer.

31. The semiconductor structure of claim 29 wherein the metal comprises an alkaline-earth-metal.

32. The semiconductor structure of claim 31 wherein the alkaline-earth-metal is selected from the group of barium and strontium.

33. The semiconductor structure of claim 29 wherein the material comprises a layer including nitrogen and oxygen formed adjacent the interface, the layer having one of an oxygen atom or a nitrogen atom adjacent and aligned in the <001> direction with a metal atom in the interface, and having one of an oxygen atom or a nitrogen atom adjacent and aligned in the <001> direction with a silicon atom in the interface.

34. The semiconductor structure of claim 29 wherein the atomic layer of the interface comprises a two dimensional periodic array including metal atoms M, silicon atoms Si, and X atoms, where X is one of nitrogen atoms or a combination of nitrogen and oxygen atoms of the form:

35. The semiconductor structure of claim 29 wherein the atomic layer of the interface and the atomic layer of the silicon substrate adjacent the interface comprises a two dimensional periodic array including metal atoms M, silicon atoms Si, and X atoms in the interface, where X is a combination of nitrogen and oxygen atoms, and silicon atoms Si' in the substrate of the form:

36. The semiconductor structure of claim 29 wherein the atomic layer of the interface comprises:
   a half of a monolayer of an alkaline-earth-metal;
   a half of a monolayer of silicon; and
   a monolayer of nitrogen and oxygen.

37. The semiconductor structure of claim 36 wherein the silicon substrate includes a layer of silicon atoms adjacent to the interface, each atom of the alkaline-earth-metal in the atomic layer adjacent to the substrate being substantially equally spaced from four silicon atoms in the silicon substrate.

38. The semiconductor structure of claim 37 wherein the interface comprises rows of atoms in a 2×1 configuration on a (001) surface of the silicon substrate, 1× in the <$\bar{1}$110> direction and 2× in the <110> direction.

39. The semiconductor structure of claim 28 wherein the silicon atoms in the interface are substantially on a line and equally spaced between the alkaline-earth-metal atoms in the <110> direction.

40. The semiconductor structure of claim 29 wherein each silicon atom in the layer of atoms in the silicon substrate adjacent to the interface is bonded to one of a oxygen or nitrogen atom in the interface and each silicon atom in the interface is bonded to two atoms in the interface, the two atoms being one of two nitrogen atoms, two oxygen atoms, or one nitrogen atom and one oxygen atom.

41. The semiconductor structure of claim 29 wherein the interface has a 2×1 reconstruction.

42. A semiconductor structure comprising:
    a silicon substrate having a surface;
    one or more successively adjacent layers of single crystal oxides or nitrides; and
    an interface between the surface of the silicon substrate and one of the one or more successively adjacent layers of single crystal oxides, nitrides, or a mixture of oxides and nitrides, comprising a single atomic layer of $MSiN_2$, where M is a metal and is lattice matched with the one of the one or more successively adjacent layers of single crystal oxides.

43. The semiconductor structure of claim 42 wherein the metal comprises an alkaline-earth-metal.

44. The semiconductor structure of claim 43 wherein the alkaline-earth-metal is selected from the group of barium and strontium.

45. The semiconductor structure of claim 42 wherein the one or more successively adjacent layers of single crystal oxides comprises an oxide layer formed adjacent the interface, the oxide layer having an oxygen atom adjacent and aligned in the <001> direction with a metal atom in the interface, and having an oxygen atom adjacent and aligned in the <001> direction with a silicon atom in the interface.

46. The semiconductor structure of claim 42 wherein the atomic layer of the interface comprises a two dimensional periodic array including metal atoms M, silicon atoms Si, and nitrogen atoms N of the form:

47. The semiconductor structure of claim 42 wherein the atomic layer of the interface and the atomic layer of the silicon substrate adjacent the interface comprises a two dimensional periodic array including metal atoms M, silicon atoms Si, and nitrogen atoms N in the substrate, and silicon atoms Si' in the substrate of the form:

48. The semiconductor structure of claim 42 wherein the atomic layer of the interface comprises:
    a half of a monolayer of an alkaline-earth-metal;
    a half of a monolayer of silicon; and
    a monolayer of nitrogen.

49. The semiconductor structure of claim 48 wherein the silicon substrate includes a layer of silicon atoms adjacent to the interface, each atom of the alkaline-earth-metal in the atomic layer of the interface being substantially equally spaced from four silicon atoms in the silicon substrate.

50. The semiconductor structure of claim 49 wherein the interface comprises rows of atoms in a 2×1 configuration on a (001) surface of the silicon substrate, 1× in the <$\bar{1}$10> direction and 2× in the <110> direction.

51. The semiconductor structure of claim 50 wherein the silicon atoms in the interface are substantially on a line and equally spaced between the alkaline-earth-metal atoms in the <110> direction.

52. The semiconductor structure of claim 42 wherein each silicon atom in the layer of atoms in the silicon substrate adjacent to the interface is bonded to an nitrogen atom in the interface and each silicon atom in the interface is bonded to two nitrogen atoms in the interface.

53. The semiconductor structure of claim 42 wherein the interface has a 2×1 reconstruction.

* * * * *